United States Patent
Lee et al.

(10) Patent No.: US 8,673,686 B2
(45) Date of Patent: Mar. 18, 2014

(54) CHIP PACKAGE STRUCTURE AND MANUFACTURING METHOD THEREOF

(76) Inventors: Hung-Jen Lee, Taipei (TW); Shu-Ming Chang, New Taipei (TW); Chen-Han Chiang, Luodong Township (TW); Tsang-Yu Liu, Zhubei (TW); Yen-Shih Ho, Kaohsiung (TW)

( * ) Notice: Subject to any disclaimer, the term of this patent is extended or adjusted under 35 U.S.C. 154(b) by 0 days.

(21) Appl. No.: 13/492,649

(22) Filed: Jun. 8, 2012

(65) Prior Publication Data
US 2012/0313261 A1 Dec. 13, 2012

Related U.S. Application Data

(60) Provisional application No. 61/495,264, filed on Jun. 9, 2011.

(51) Int. Cl.
*H01L 21/44* (2006.01)
(52) U.S. Cl.
USPC .......................................... 438/110
(58) Field of Classification Search
USPC ............... 257/777; 438/68, 114, 110, 33, 113
See application file for complete search history.

(56) References Cited

U.S. PATENT DOCUMENTS

| | | | | |
|---|---|---|---|---|
| 6,830,958 B2* | 12/2004 | Makimoto | ..................... | 438/110 |
| 7,015,064 B1* | 3/2006 | Patwardhan et al. | ......... | 438/106 |
| 7,067,397 B1 | 6/2006 | Chang-Chien et al. | | |
| 7,256,066 B2* | 8/2007 | Chen et al. | ..................... | 438/106 |
| 7,902,650 B2* | 3/2011 | Hu et al. | ........................ | 257/678 |
| 8,399,295 B2* | 3/2013 | Kishii et al. | .................. | 438/107 |
| 8,409,925 B2* | 4/2013 | Lee et al. | ...................... | 438/110 |
| 2001/0041381 A1* | 11/2001 | Choi | ............................. | 438/106 |
| 2010/0261313 A1* | 10/2010 | Toh et al. | ...................... | 438/109 |

FOREIGN PATENT DOCUMENTS

CN 101047134 10/2007

* cited by examiner

*Primary Examiner* — Thao Le
(74) *Attorney, Agent, or Firm* — Liu & Liu

(57) ABSTRACT

An embodiment of the present invention provides a manufacturing method of a chip package structure including: providing a first substrate having a plurality of predetermined scribe lines defining a plurality of device regions; bonding a second substrate to the first substrate, wherein a spacing layer is disposed therebetween and has a plurality of chip support rings located in the device regions respectively, a cutting support structure located on peripheries of the chip support rings, a plurality of stop rings surrounding the chip support rings respectively, wherein a gap pattern separating the stop rings from the cutting support structure and the chip support rings; and cutting the first substrate and the second substrate to form a plurality of chip packages. Another embodiment of the present invention provides a chip package structure.

14 Claims, 19 Drawing Sheets

CHIP PACKAGE STRUCTURE AND MANUFACTURING METHOD THEREOF

CROSS REFERENCE TO RELATED APPLICATIONS

This application claims the benefit of U.S. Provisional Application No. 61/495,264, filed on Jun. 9, 2011, the entirety of which is incorporated by reference herein.

BACKGROUND OF THE INVENTION

1. Field of the Invention

The present invention relates to a chip package structure, and in particular relates to a chip package structure formed by a wafer-level process and a manufacturing method thereof.

2. Description of the Related Art

Along with the trend towards light, thin, short, and small electronic devices, semiconductor chip package structures accordingly tend to be multi-chip package (MCP) structures to achieve requirements of multi-function and high performance. Multi-chip package (MCP) structures integrate a variety of semiconductor chips in a single package, such as logic chips, analog chips, control chips, or memory chips.

Multi-chip package structures may be fabricated by a wafer-level packaging process. For example, different kinds of semiconductor wafers may be stacked and bonded to each other to form a wafer stacking structure. Then, the wafer stacking structure is cut to form a plurality of multi-chip package structures. However, because the portion of the wafer contacting the cutting knife is easy to be damaged due to high stress, edges of chips of the multi-chip package structures usually suffer problems of having damaged vertices or cracks.

BRIEF SUMMARY OF THE INVENTION

An embodiment of the invention provides a manufacturing method of a chip package structure which includes: providing a first substrate having a plurality of predetermined scribe lines for defining a plurality of device regions; bonding a second substrate to the first substrate with a spacing layer disposed therebetween, wherein the spacing layer has a plurality of chip support rings located in the device regions, a cutting support structure located on peripheries of the chip support rings, and a gap pattern separating the cutting support structure from the chip support rings; and cutting the first substrate and the second substrate along the predetermined scribe lines to form a plurality of chip package structures.

An embodiment of the invention provides a chip package structure, which includes: a first substrate; a second substrate disposed on the first substrate; and a spacing layer disposed between the first substrate and the second substrate to separate the first substrate from the second substrate, wherein the spacing layer has a chip support ring and an outer wall structure located on a periphery of the chip support ring, and the chip support ring and the outer wall structure are separated from each other by a gap therebetween.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

An embodiment of the present invention provides a chip package structure and manufacturing methods thereof. The chip package structure of the embodiments of the invention may be applied to, for example, active or passive devices, or electronic components with digital or analog circuits, such as opto electronic devices, micro electro mechanical systems (MEMS), micro fluidic systems, and physical sensors for detecting heat, light, or pressure. Particularly, a wafer scale packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale packaging process mentioned above mainly means that after the packaging process is accomplished during the wafer stage, the wafer with chips is cut to obtain separate independent packages. However, in a specific embodiment, separate independent chips may be redistributed overlying a supporting wafer and then be packaged, which may also be referred to as a wafer scale packaging process. In addition, the above mentioned wafer scale packaging process may also be adapted to form chip packages of multi-layer integrated circuit devices by stacking a plurality of wafers having integrated circuits.

Figure 1:
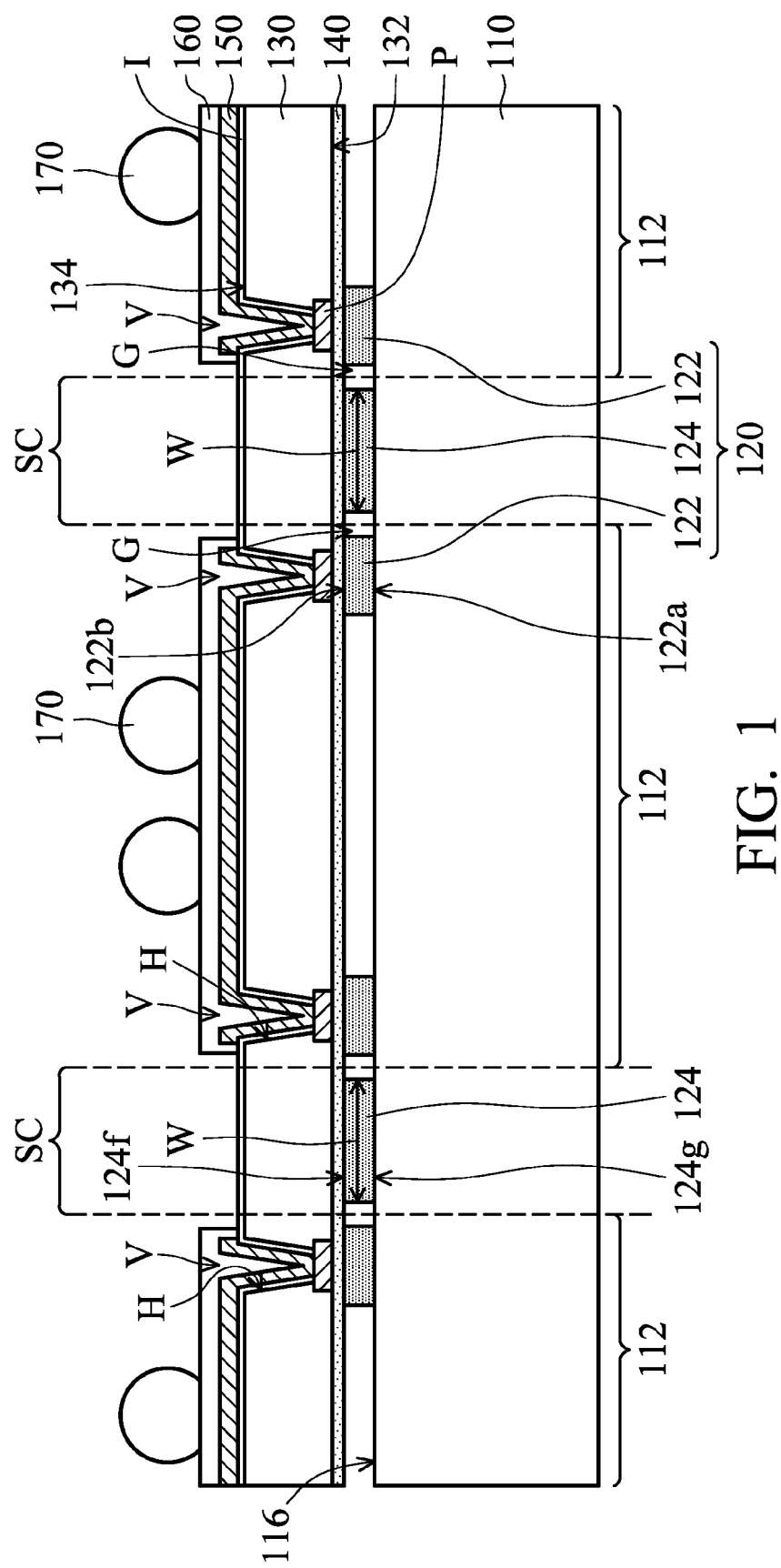
FIGS. 1 and 2 are cross-sectional views illustrating a manufacturing process of a chip package structure according to an embodiment of the present invention.
Figure 2:
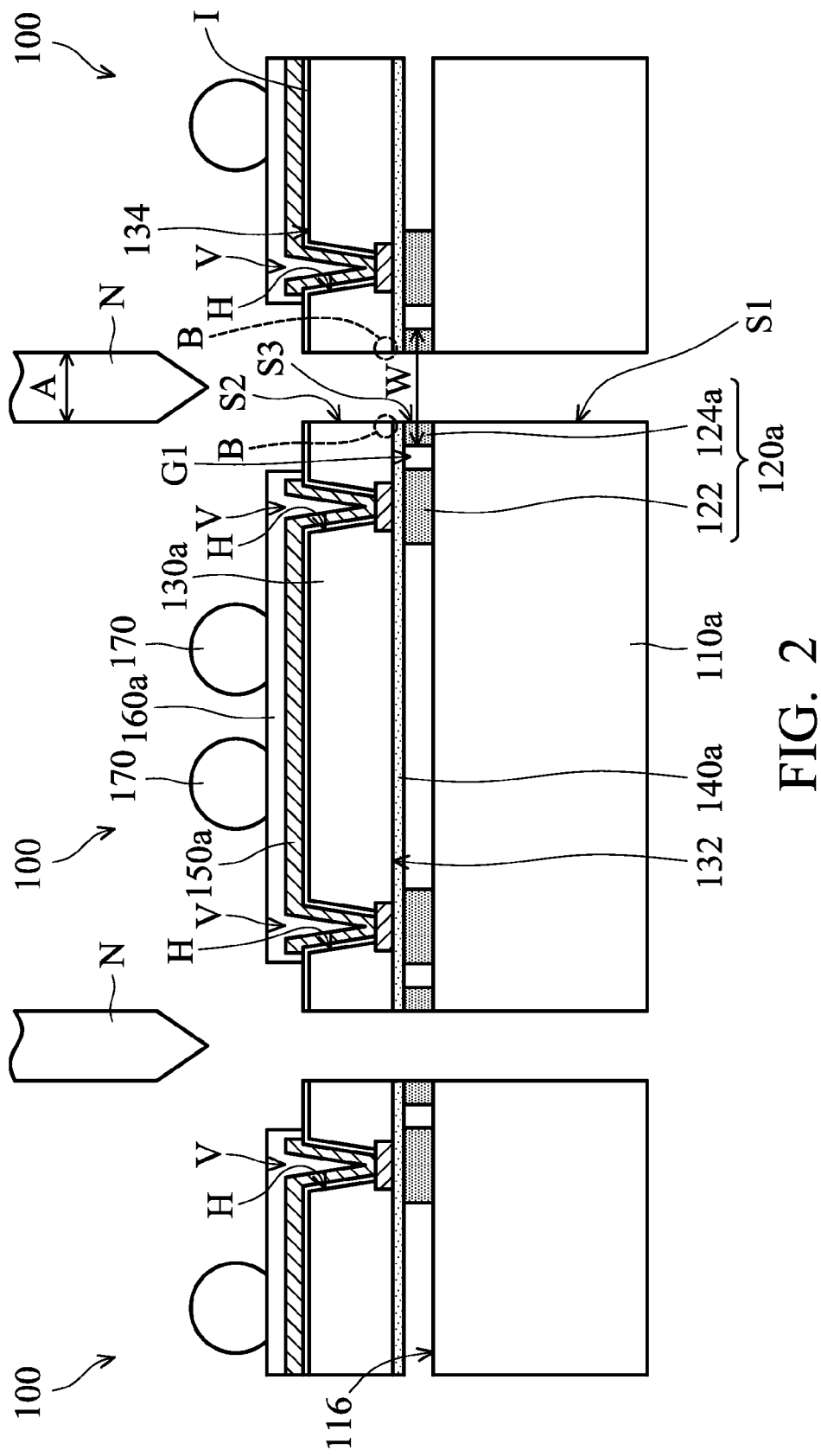
Figure 3:
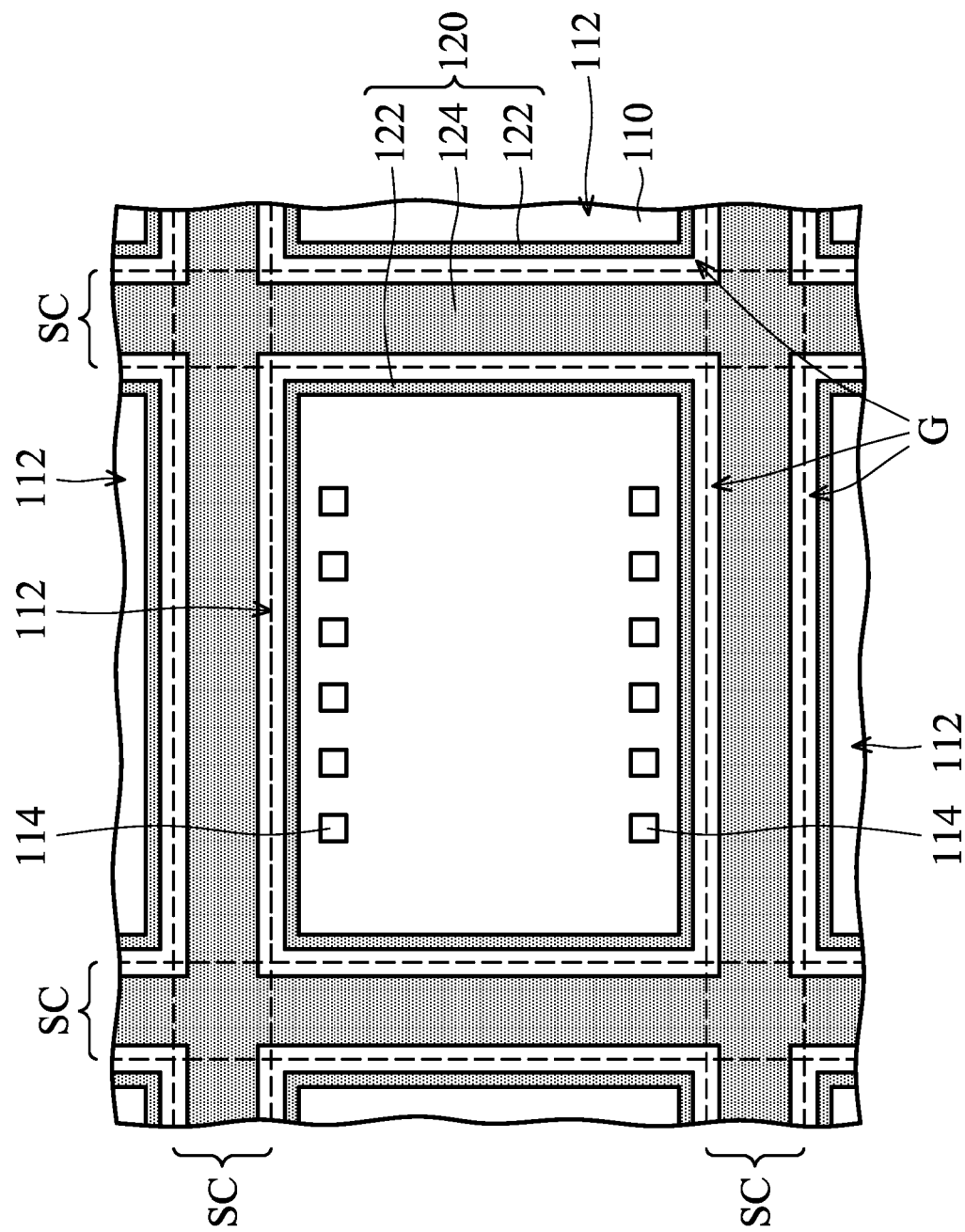
FIG. 3 is a top view of the substrate (lower substrate) and the spacing layer of FIG. 1.

FIGS. 1 and 2 are cross-sectional views illustrating a manufacturing process of a chip package structure according to an embodiment of the present invention. FIG. 3 is a top view of the substrate (lower substrate) and the spacing layer of FIG. 1.

Referring to FIGS. 1 and 3, a substrate 110 is provided, and the substrate 110 has a plurality of predetermined scribe lines SC for defining a plurality of device regions 112. A plurality of bonding pads 114 may be formed in the device regions 112.

Then, a spacing layer 120 is formed on the substrate 110 and has a plurality of chip support rings 122 and a cutting support structure 124. The chip support rings 122 are located in the device regions 112 respectively. The cutting support structure 124 is located on peripheries of the chip support rings 122. In the present embodiment, the cutting support structure 124 is located on the predetermined scribe lines SC and between any two neighboring chip support rings 122. The spacing layer 120 has a gap pattern G separating the cutting support structure 124 from the chip support rings 122, such that the cutting support structure 124 and the chip support rings 122 are separated from each other.

It should be noted that, although the cutting support structure 124 depicted in FIG. 3 is a continuous structure, it is not limited thereto. That is to say, the cutting support structure 124 may be a discontinuous structure formed of a plurality of discontinuous portions on the predetermined scribe lines SC.

Then, a substrate 130 is provided, wherein the substrate 130 has two opposite surfaces 132 and 134. In one embodiment, a protective layer 140 covering the surface 132 may be formed to prevent moisture of environment from diffusing into the substrate 130 from the surface 132. For example, the substrate 130 is a silicon wafer, and the protective layer 140 is a silicon oxide layer. Also, a circuit layer 150, an insulating layer 160 covering the circuit layer 150, and a plurality of conductive bumps 170 (e.g. solder balls) on the insulating layer 160 and electrically connecting the circuit layer 150 may be optionally formed on the surface 134 of the substrate 130.

In one embodiment, a plurality of through substrate vias (TSV) V are formed in the substrate 130. Specifically, a plurality of through holes H passing through the substrate 130 are formed and expose the pads P on the surface 132. An insulating layer I is formed on the substrate 130 to cover the surface 134 and the inner walls of the through holes H. The circuit layer 150 extends into the through holes H to electrically connect to the pads P, wherein the insulating layer I separates the circuit layer 150 from the substrate 130 to electrically insulate the circuit layer 150 from the substrate 130. In one embodiment, at least one of the substrates 110 and 130 has the through substrate vias V. Although FIG. 1 shows the through substrate vias V formed in the substrate 130, it is not limited thereto. For example, the through substrate vias V may be formed in the substrate 110 or both of the substrates 110 and 130.

Then, the substrate 130 is bonded to the substrate 110, with the spacing layer 120 sandwiched between the substrates 110 and 130, wherein the protective layer 140 is between the substrate 130 and the spacing layer 120.

It should be noted that, in the present embodiment, although the spacing layer 120 is formed on the substrate 110 before bonding, the invention is not limited thereto. In other embodiments, the spacing layer 120 may be formed on the substrate 130 before bonding.

Then, referring to FIGS. 1 and 2, the substrate 110, the substrate 130 and the cutting support structure 124 are cut along the predetermined scribe lines SC by using a cutting knife N to form a plurality of chip package structures 100. In the present embodiment, a thickness A of the cutting knife N is less than a width W of a portion of the cutting support structure 124 on one of the predetermined scribe lines SC. Thus, after the cutting process, a portion of the cutting support structure 124 may be left in the chip package structures 100. For example, the chip package structure 100 may have an outer wall structure 124a formed from the remaining portion of the cutting support structure 124.

It should be noted that, in the present embodiment, because the cutting support structure 124 is formed between the chip support rings 122 and on the predetermined scribe lines SC, the cutting support structure 124 and the chip support rings 122 adjacent thereto may jointly support the substrate 130 on the predetermined scribe lines SC. Thus, a sharp cutting edge (as shown in region B) of the substrate 130 can be provided. By contrast, in the conventional cutting process, the portion of the wafer being cut is easily damaged due to high stress and lack of mechanical support, and therefore cutting edges of chips usually suffer from problems of damaged corners or cracks. In other words, the cutting support structure 124 may serve as a buffer dam (or a buffer structure) to buffer the stress applied on the substrate 130 during the cutting process.

In one embodiment, the step of cutting the substrates 110 and 130 may include first cutting one of the substrates 110 and 130 having the through substrate vias V. Although FIGS. 1 and 2 show that the substrate 130 has the through substrate vias V and is cut before the substrate 110, this invention is not limited thereto. For example, in another embodiment (not shown), the substrate 110 may have the through substrate vias V and is cut first.

In one embodiment, the cutting support structure 124 has a non-bonding surface 124g facing the substrate 110 and a bonding surface 124f facing the substrate 130. The step of cutting the substrates 110 and 130 includes, for example, first cutting one of the substrates 110 and 130 adjacent to the bonding surface 124f.

FIGS. 1 and 2 show that the substrate 130 is adjacent to the bonding surface 124f and is cut first. In this case, the bonding surface 124f of the cutting support structure 124 may effectively block the propagation of cracks produced in the protective layer 140 during the cutting process. The non-bonding surface 124g does not bond with the substrate 110. Specifically, the non-bonding surface 124g is separated from the substrate 110 by a gap (not shown), or is just in contact with the substrate 110 but not bonded to the substrate 110. The non-bonding surface 124g includes, for example, an aluminum-silicon dioxide interface. Specifically, the cutting support structure 124 is formed of aluminum, and a silicon dioxide layer (not shown) may be formed on the surface 116 of the substrate 110 as a protective layer, wherein the cutting support structure 124 does not bond with the silicon dioxide layer.

Although FIGS. 1 and 2 shows that the substrate 130 is adjacent to the bonding surface 124f and is cut first, this invention is not limited thereto. For example, in another embodiment (not shown), the cutting support structure 124 may have another bonding surface adjacent to the substrate 110, and the substrate 110 is cut first. In this case, the bonding surface may effectively block the propagation of cracks produced in the protective layer (not shown) on the surface 116 of the substrate 110 during the cutting process.

In one embodiment, the chip support rings 122 have a bonding surface 122a adjacent to the substrate 110 and a bonding surface 122b adjacent to the substrate 130. The bonding surfaces 124f and 122b bond to the protective layer 140, and the bonding surface 122a bonds to the substrate 110. The bonding surfaces 124f, 122a, and 122b may be, for example, metal-semiconductor interfaces (e.g. aluminum-germanium interface), or metal-metal interfaces. Specifically, the cutting support structure 124 is formed of aluminum, and a germanium layer (not shown) may be formed on the substrates 110 and 130 to bond the cutting support structure 124 and the chip support rings 122.

Figure 4:
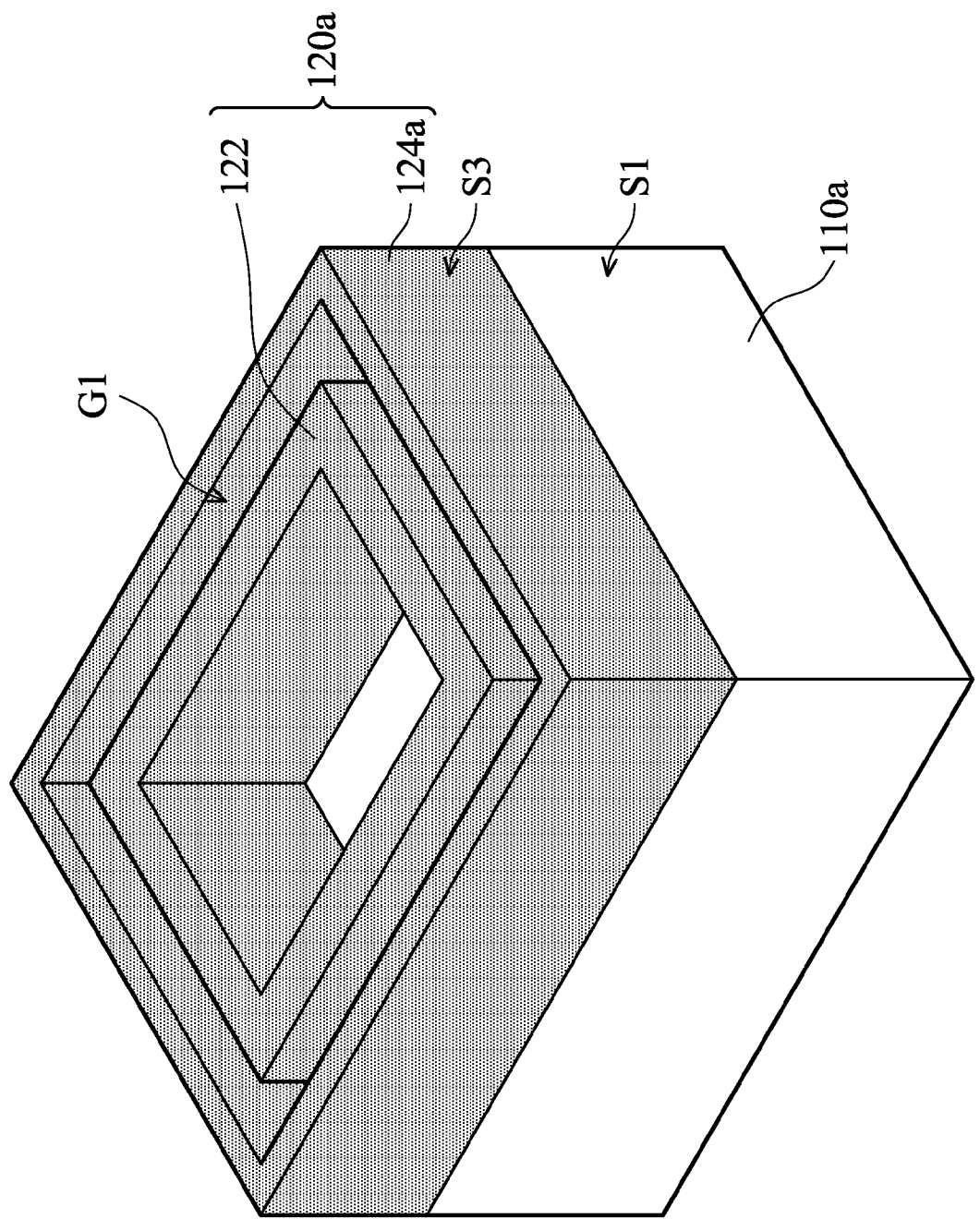
FIG. 4 is a perspective view of the substrate (lower substrate) and the spacing layer of FIG. 2.

The chip package structure 100 is described in detail below. FIG. 4 is a perspective view of the substrate (lower substrate) and the spacing layer of FIG. 2.

Referring to FIGS. 2 and 4, the chip package structure 100 includes a substrate 110a, a substrate 130a and a spacing layer 120a, wherein the substrate 130a is disposed on the substrate 110a. The substrate 110a is, for example, a chip, such as a micro electro-mechanical system sensor chip (MEMS sensor chip). The substrate 130a is, for example, another kind of chip, such as an application specific integrated circuit (ASIC) chip.

In another embodiment, the substrate 130a is a micro electro-mechanical system sensor chip (MEMS sensor chip). The substrate 110a is, for example, an application specific integrated circuit (ASIC) chip.

The spacing layer 120a is disposed between the substrate 110a and the substrate 130a to separate the substrate 110a from the substrate 130a. A material of the spacing layer 120a is, for example, alloy (e.g. germanium alloy), polymer materials, or other materials suitable to connect to chips.

The spacing layer 120a has a chip support ring 122 and an outer wall structure 124a located on a periphery of the chip support ring 122, and the chip support ring 122 and the outer wall structure 124a are separated from each other by a gap G1 therebetween. In one embodiment, the edges of the outer wall structure 124a, the substrate 110a and the substrate 130a are aligned to one another. Specifically, a sidewall S1 of the substrate 110a, a sidewall S2 of the substrate 130a and a sidewall S3 of the outer wall structure 124a are coplanar with one another to form a common plane. In one embodiment, the outer wall structure 124a is a ring structure surrounding the chip support ring 122.

Also, a protective layer 140a may cover a surface 132 of the substrate 130a and may be located between the substrate 130a and the spacing layer 120a. A material of the protective layer 140a is, for example, oxides (e.g. silicon oxides), or other insulating materials suitable to be formed on chips and block moisture. Also, a circuit layer 150a, an insulating layer 160a covering the circuit layer 150a, and a plurality of conductive bumps 170 on the insulating layer 160a and electrically connecting the circuit layer 150a may be optionally formed on the surface 134 of the substrate 130a.

Figure 5:
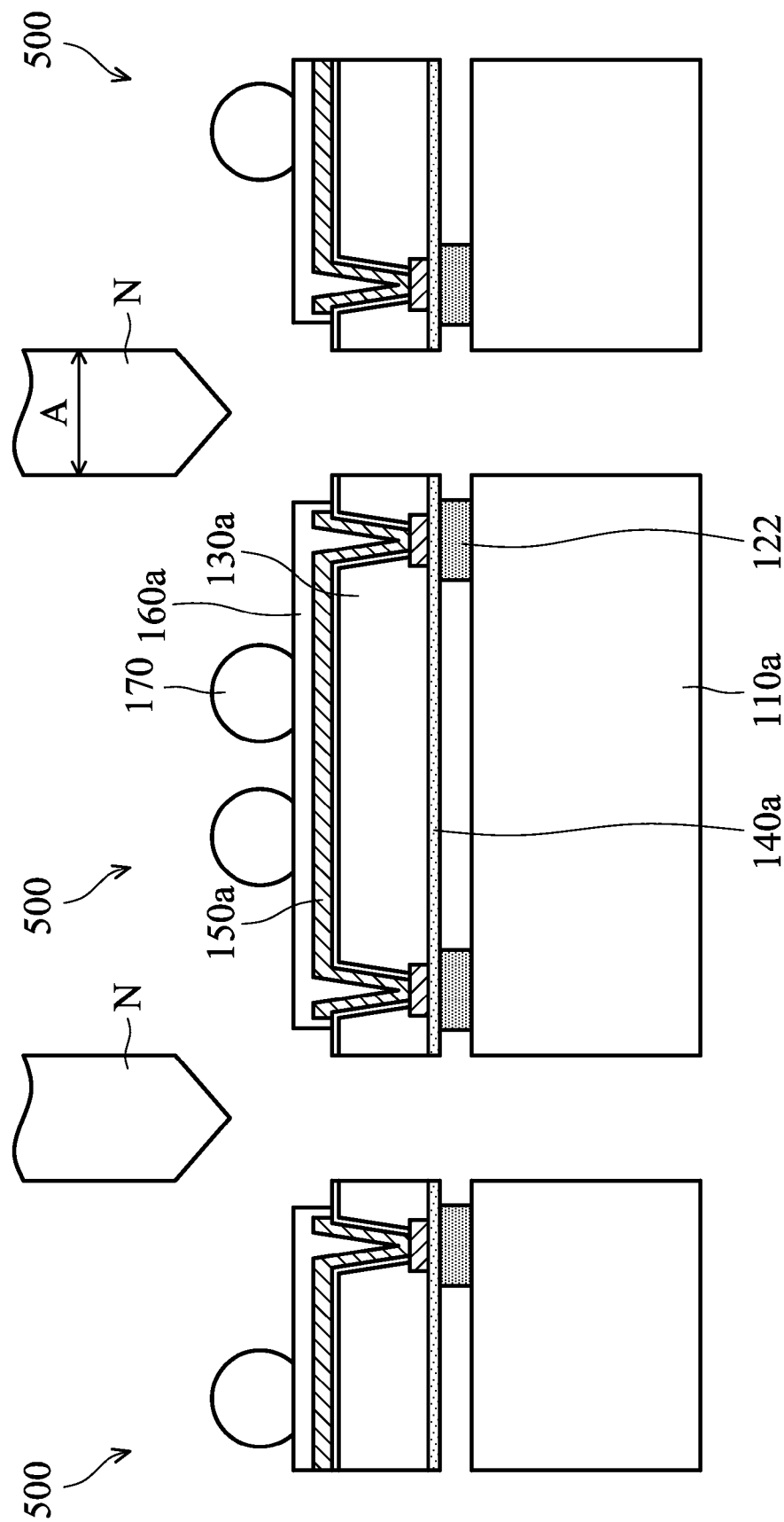
FIG. 5 is a cross-sectional view illustrating a manufacturing process of a chip package structure according to another embodiment of the present invention.

FIG. 5 is a cross-sectional view illustrating a manufacturing process of a chip package structure according to another embodiment of the present invention. In another embodiment, after the process step of FIG. 1, the process of FIG. 5 is selectively performed. That is to say, as shown in FIGS. 1 and 5, the substrate 110, the substrate 130 and the cutting support structure 124 are cut along the predetermined scribe lines SC by using a cutting knife N to form a plurality of chip package structures 500. A thickness A of the cutting knife N is larger than a width W of a portion of the cutting support structure 124 on one of the predetermined scribe lines SC. In this case, because the thickness of the cutting knife N is larger, the cutting support structure 124 may be removed completely by using the cutting knife N to form a plurality of chip package structures 500 without the outer wall structure 124a of FIG. 2.

Figure 6:
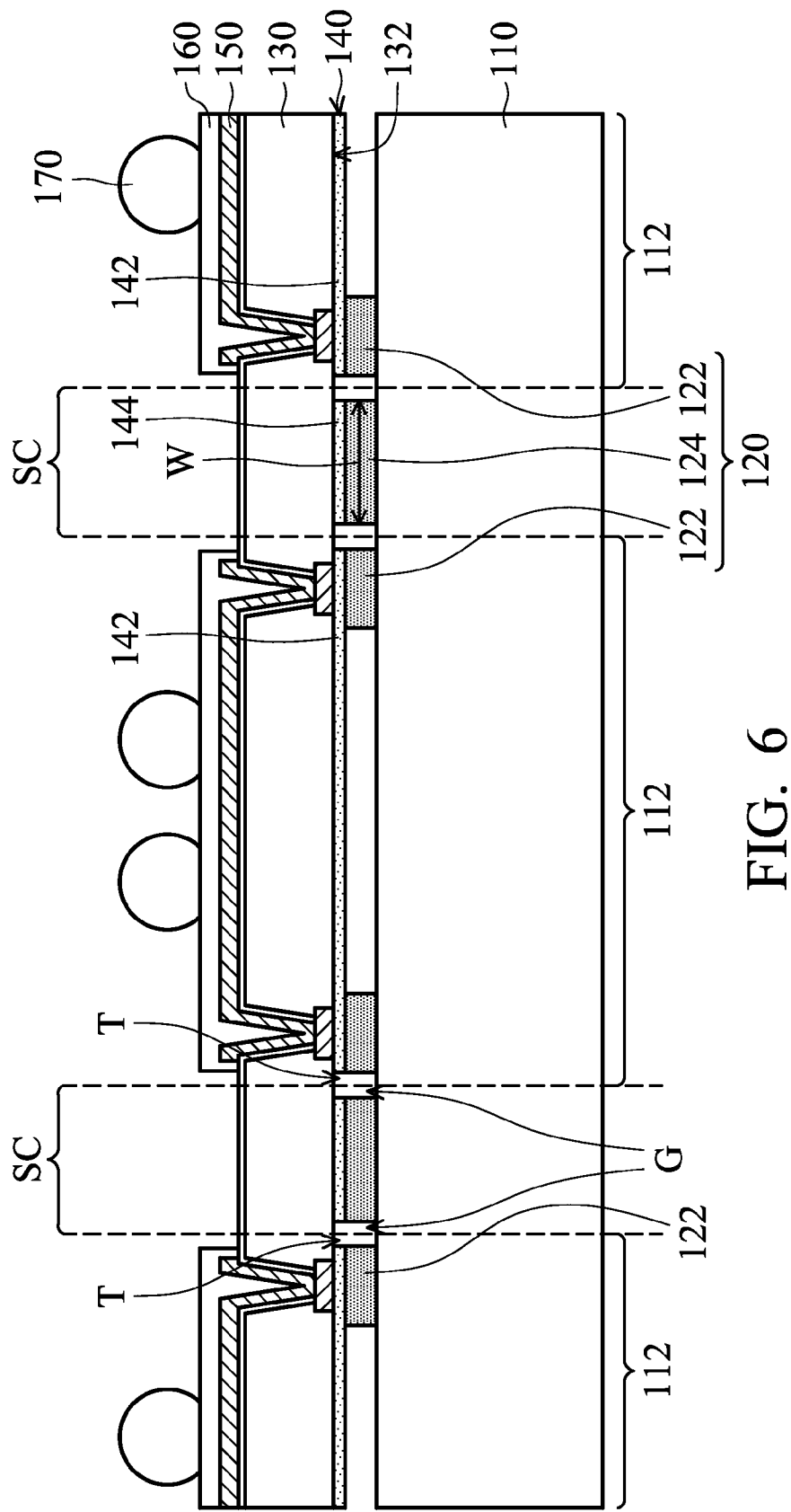
FIGS. 6 and 7 are cross-sectional views illustrating a manufacturing process of a chip package structure according to an embodiment of the present invention.
Figure 7:
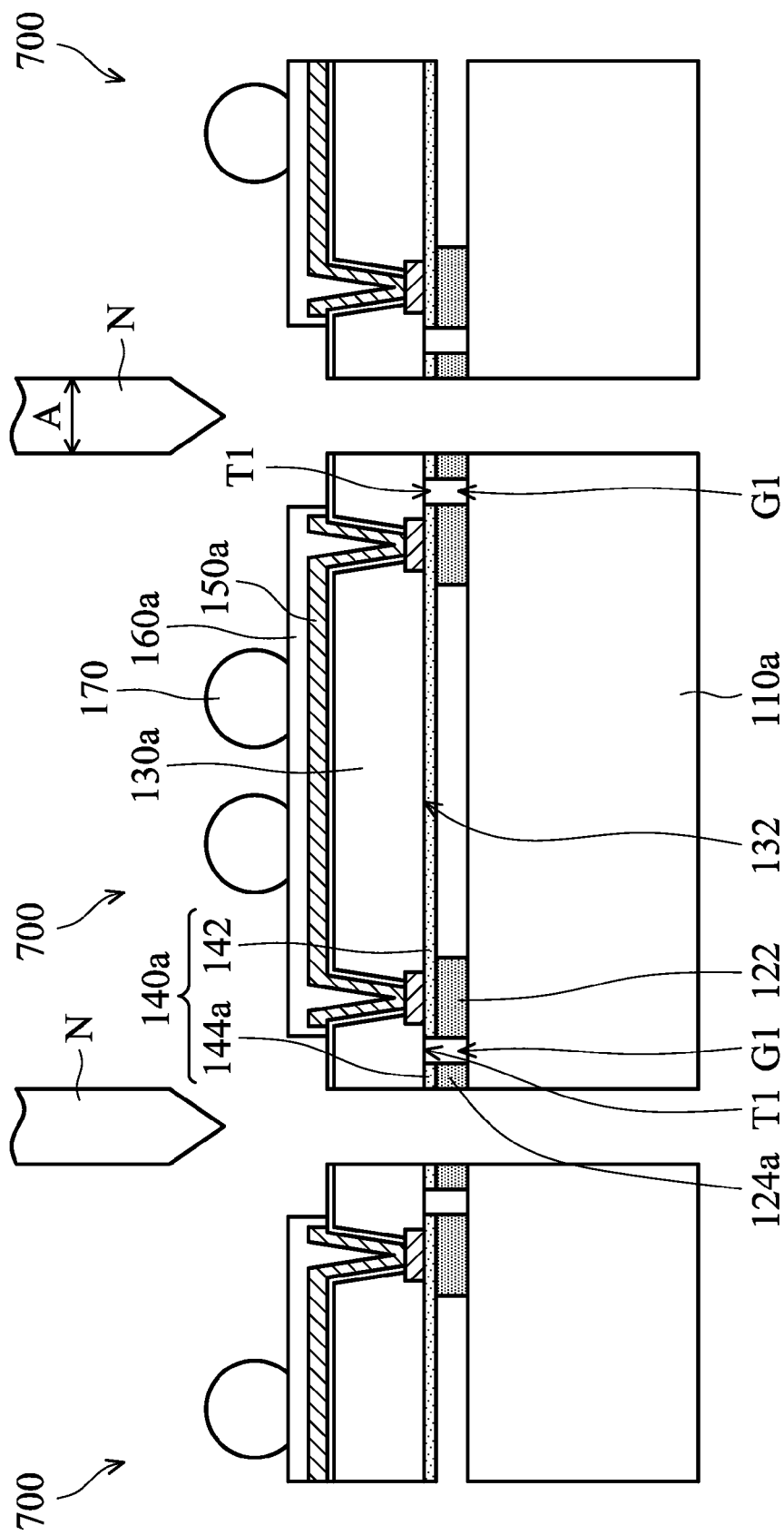
Figure 8:
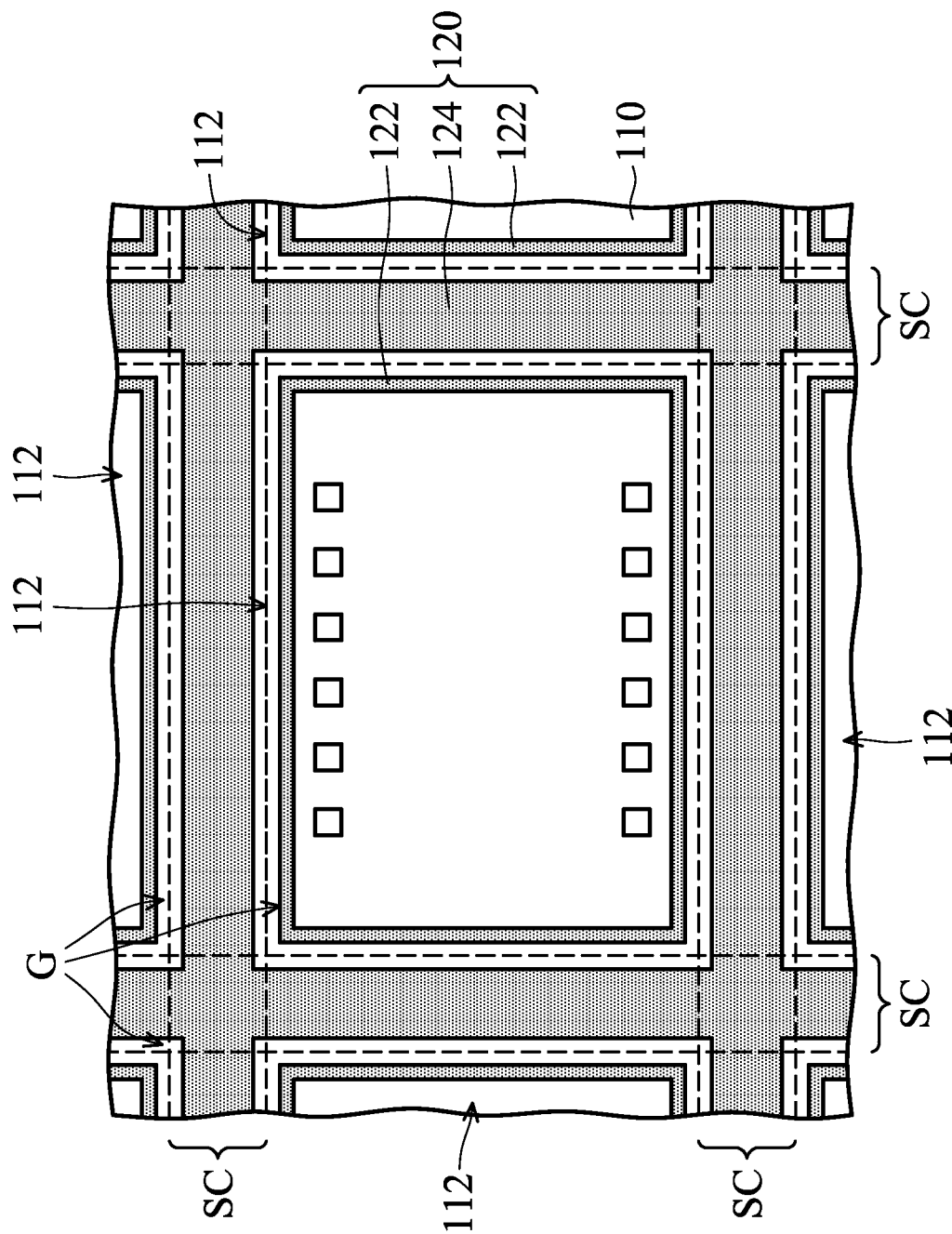
FIG. 8 is a top view of the substrate (lower substrate) and the spacing layer of FIG. 6.

FIGS. 6 and 7 are cross-sectional views illustrating a manufacturing process of a chip package structure according to an embodiment of the present invention. FIG. 8 is a top view of the substrate (lower substrate) and the spacing layer of FIG. 6. Referring to FIGS. 6 and 8, a substrate 110 is provided, and a spacing layer 120 is formed thereon, wherein the substrate 110 and the spacing layer 120 are structurally similar to the substrate 110 and the spacing layer 120 of FIGS. 1 and 3, and thus description thereof is not repeated hereafter.

Figure 9:
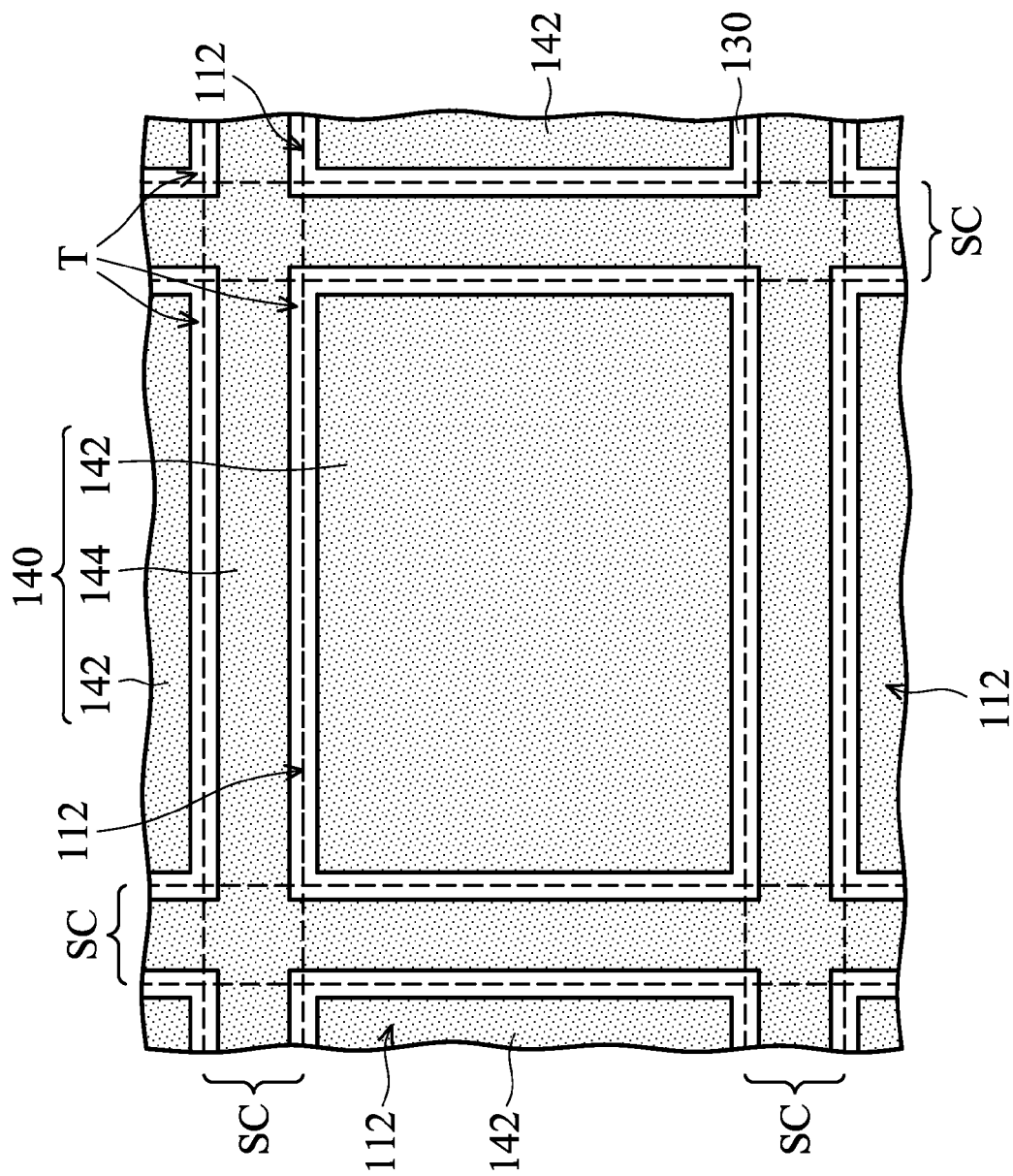
FIG. 9 is a bottom view of a substrate (upper substrate) and the protective layer of FIG. 6.

FIG. 9 is a bottom view of a substrate (upper substrate) and the protective layer of FIG. 6. Referring to FIGS. 6, 8 and 9, a substrate 130 is provided, and a protective layer 140 is formed on a surface 132 of the substrate 130. A notch pattern T passing through the protective layer 140 is formed and is corresponding to the gap pattern G. The notch pattern T divides the protective layer 140 into a plurality of center portions 142 in the device regions 112 respectively and a periphery portion 144 on the scribe lines SC, wherein the center portions 142 and the periphery portion 144 are separated from each other.

Then, the substrate 130 is bonded to the substrate 110, with the spacing layer 120 disposed between the substrates 110 and 130, wherein the notch pattern T of the protective layer 140 is aligned to the gap pattern G of the spacing layer 120.

Then, referring to FIGS. 6 and 7, the substrate 110, the substrate 130 and the cutting support structure 124 are cut along the predetermined scribe lines SC by using a cutting knife N to form a plurality of chip package structures 700. In the present embodiment, a thickness A of the cutting knife N is less than a width W of a portion of the cutting support structure 124 on one of the predetermined scribe lines SC. Thus, after the cutting process, a portion of the cutting support structure 124 may be left in the chip package structures 700. For example, the chip package structure 700 may have an outer wall structure 124a formed from the remaining portion of the cutting support structure 124.

It should be noted that, the chip package structure 700 of the present embodiment is structurally similar to the chip package structure 100 of FIG. 2, except that the protective layer 140a of the present embodiment has a notch T1 passing through the protective layer 140a and aligned to the gap G1 between the chip support ring 122 and the outer wall structure 124a.

The notch T1 divides the protective layer 140a into a center portion 142 and a periphery portion 144a surrounding the center portion 142, wherein the center portion 142 and the periphery portion 144a are separated from each other, the chip support ring 122 is on the center portion 142, and the outer wall structure 124a is on the periphery portion 144a.

It should be noted that, the center portion 142 and the periphery portion 144a of the protective layer 140a are separated from each other. Thus, even if cracks are produced in the periphery portion 144a during the cutting process, the cracks at most propagate to the notch T1 but not to the center portion 142. Thus, the notch T1 can effectively block the propagation of the cracks.

Figure 10:
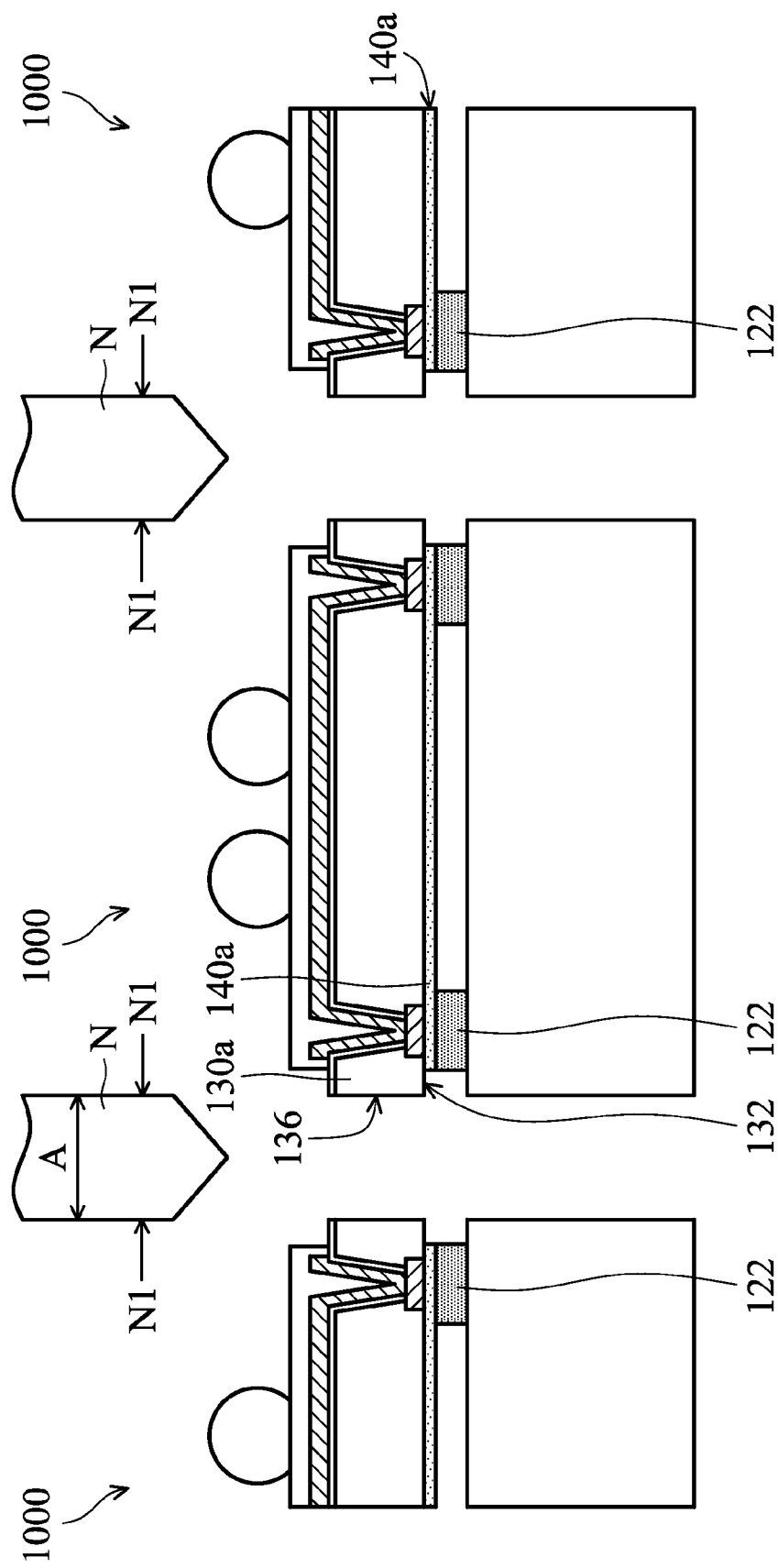
FIG. 10 is a cross-sectional view illustrating a manufacturing process of a chip package structure according to another embodiment of the present invention.

FIG. 10 is a cross-sectional view illustrating a manufacturing process of a chip package structure according to another embodiment of the present invention. In another embodiment, after the process step of FIG. 6, the process of FIG. 10 is selectively performed. That is to say, as shown in FIGS. 6 and 10, the substrate 110, the substrate 130 and the cutting support structure 124 are cut along the predetermined scribe lines SC by using a cutting knife N to form a plurality of chip package structures 1000. A thickness A of the cutting knife N is larger than a width W of a portion of the cutting support structure 124 on one of the predetermined scribe lines SC. In this case, because the thickness of the cutting knife N is larger, the cutting support structure 124 may be removed completely by using the cutting knife N.

It should be noted that, in the present embodiment, because the thickness of the cutting knife N is larger, the edge N1 of the cutting knife N may pass through the gap pattern G between the chip support ring 122 and the cutting support structure 124, and also pass through the notch pattern T aligned to the gap pattern G during the cutting process, and thus the cutting knife N does not contact the center portion 142 of the protective layer 140. As such, the embodiment may effectively avoid conventional problems that the protective layer in the device regions is cut by the cutting knife, which results in cracks produced in the protective layer in the device regions, which in turn, results in moisture diffusion to the device regions.

The chip package structure 1000 of the present embodiment is similar to the chip package structure 500 of FIG. 5, except that the protective layer 140a and the chip support ring 122 of the present embodiment both expose a portion of the surface 132 of the substrate 130a neighboring the edge 136 of the substrate 130a.

Figure 11:
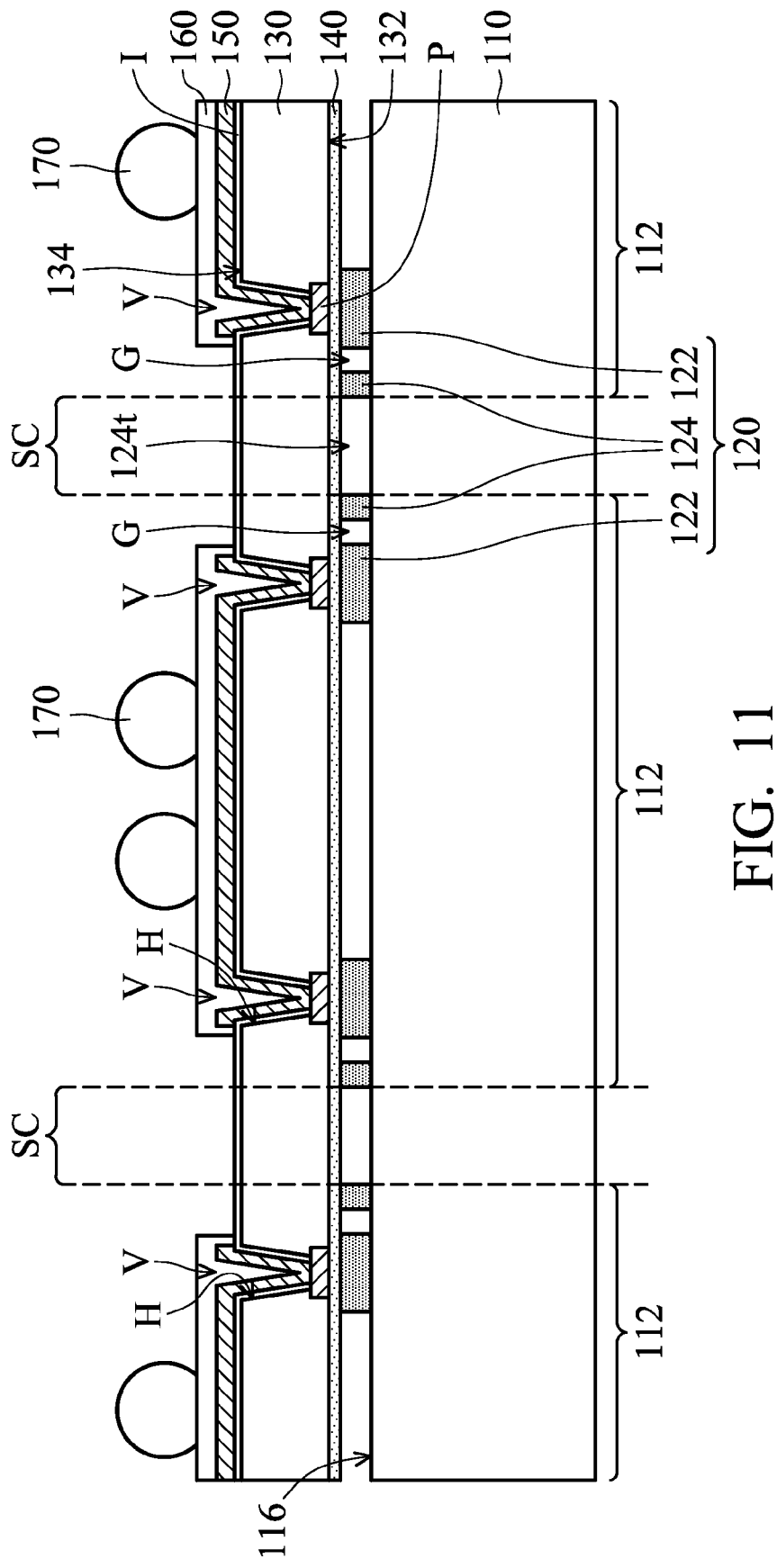
FIGS. 11 and 12 are cross-sectional views illustrating a manufacturing process of a chip package structure according to an embodiment of the present invention.
Figure 12:
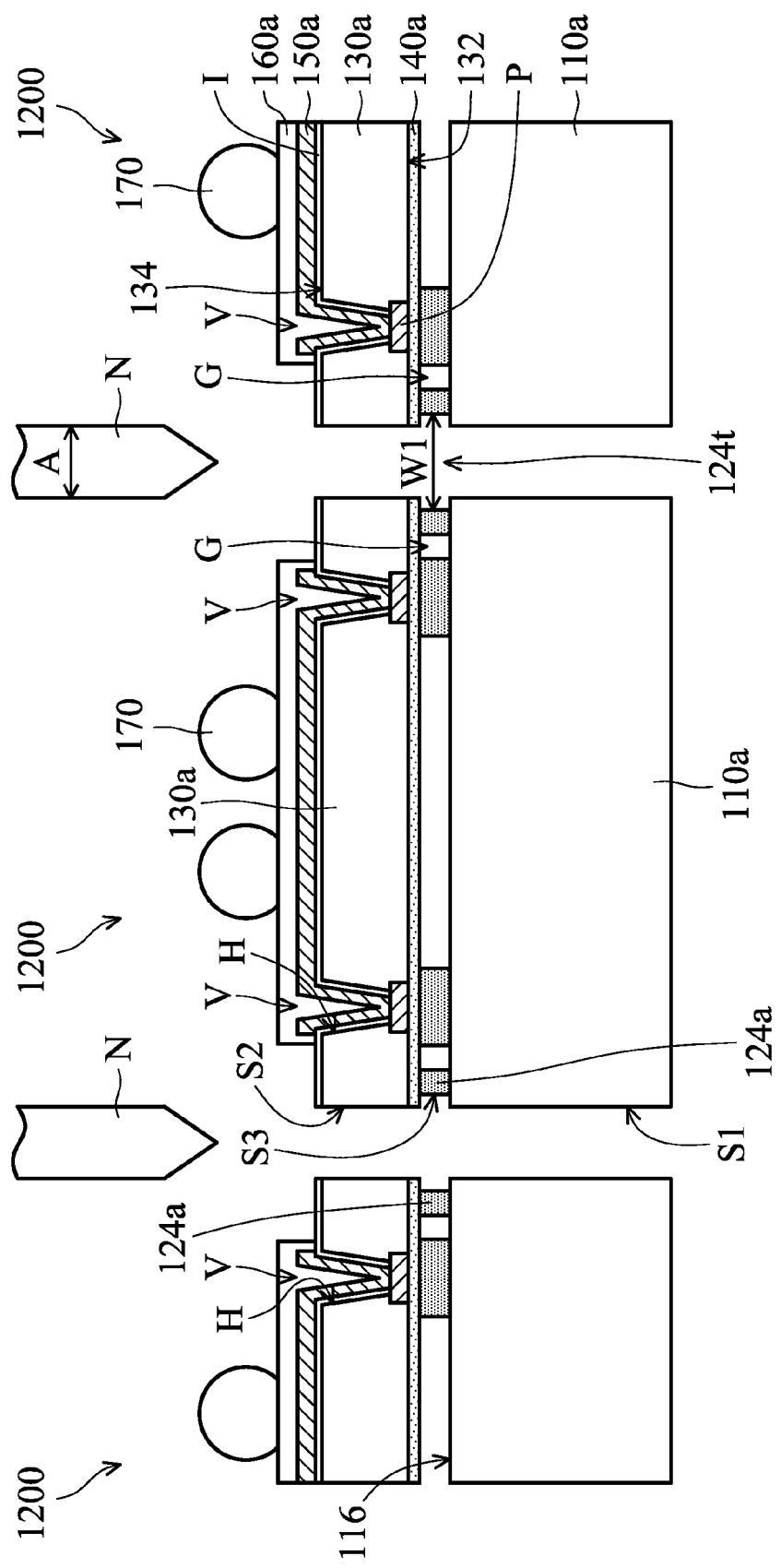
Figure 13:
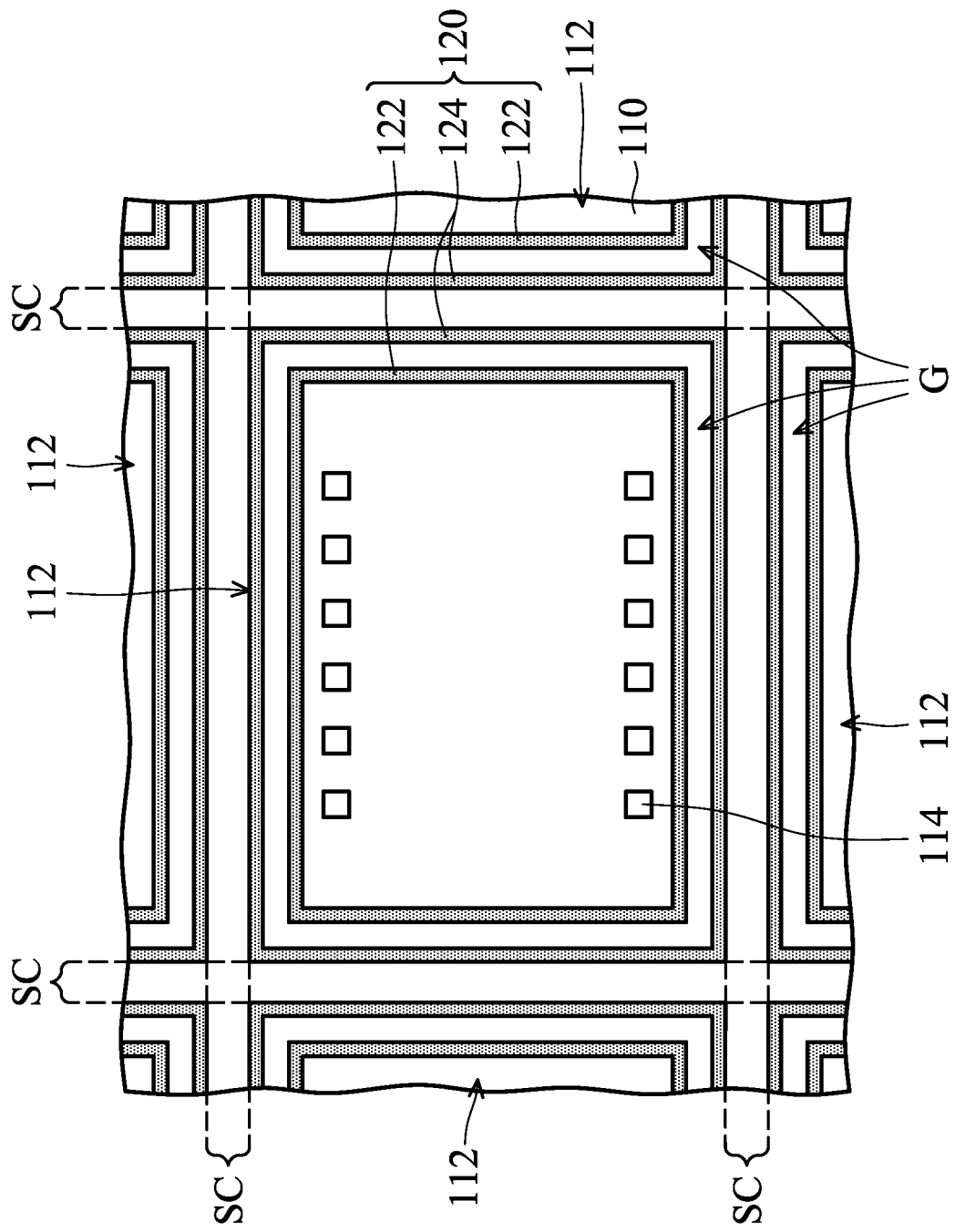
FIG. 13 is a top view of the substrate (lower substrate) and the spacing layer of FIG. 11.

FIGS. 11 and 12 are cross-sectional views illustrating a manufacturing process of a chip package structure according to an embodiment of the present invention. FIG. 13 is a top view of the substrate (lower substrate) and the spacing layer of FIG. 11. Referring to FIGS. 11 and 13, a substrate 110 is provided, and a spacing layer 120 is formed thereon, wherein the substrate 110 is structurally similar to the substrate 110 of FIG. 1, and thus description thereof is not repeated hereafter. The spacing layer 120 has a plurality of chip support rings 122 and a cutting support structure 124, wherein the cutting support structure 124 is located adjacent to the predetermined scribe lines SC, not on the predetermined scribe lines SC. Specifically, the cutting support structure 124 has a trench 124t passing therethrough and on the predetermined scribe lines SC. The chip support rings 122 is structurally similar to the chip support rings 122 of FIG. 1, and thus description thereof is not repeated hereafter.

A substrate 130 is provided, and a protective layer 140 is formed on a surface 132 of the substrate 130. Then, the substrate 130 is bonded to the substrate 110, with the spacing layer 120 sandwiched between the substrates 110 and 130.

Then, referring to FIGS. 11 and 12, the substrates 110 and 130 are cut along the predetermined scribe lines SC by using a cutting knife N to form a plurality of chip package structures 1200. In the present embodiment, a thickness A of the cutting knife N is less than a width W1 of the trench 124t on one of the predetermined scribe lines SC.

It should be noted that, the chip package structure 1200 of the present embodiment is structurally similar to the chip package structure 100 of FIG. 2, except that the chip package structure 1200 includes an outer wall structure 124a formed from the cutting support structure 124, and a sidewall S3 of the outer wall structure 124a is recessed inwardly from sidewalls S1 and S2 of the substrates 110a and 130a.

Figure 14:
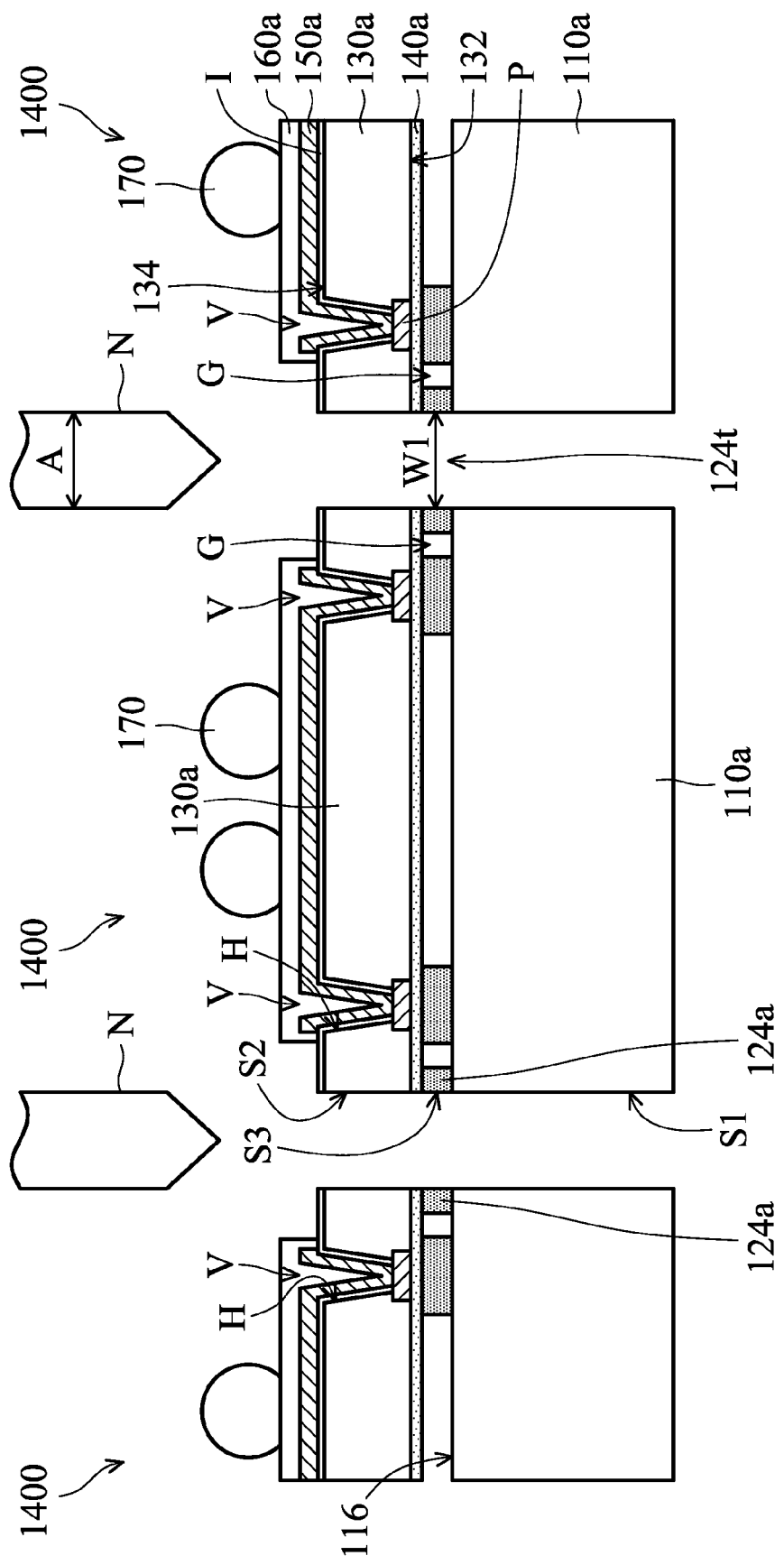
FIG. 14 is a cross-sectional view illustrating a manufacturing process of a chip package structure according to another embodiment of the present invention.

FIG. 14 is a cross-sectional view illustrating a manufacturing process of a chip package structure according to another embodiment of the present invention. In another embodiment, after the process step of FIG. 11, the process of FIG. 14 is performed. That is to say, as shown in FIGS. 11 and 14, the substrates 110 and 130 are cut along the predetermined scribe lines SC by using a cutting knife N to form a plurality of chip package structures 1400. A thickness A of the cutting knife N is equal to a width W1 of the trench 124t on one of the predetermined scribe lines SC. In this case, because the thickness A of the cutting knife N is equal to the width W1, the sidewall S3 of the outer wall structure 124a is coplanar with sidewalls S1 and S2 of the substrates 110a and 130a.

Figure 15:
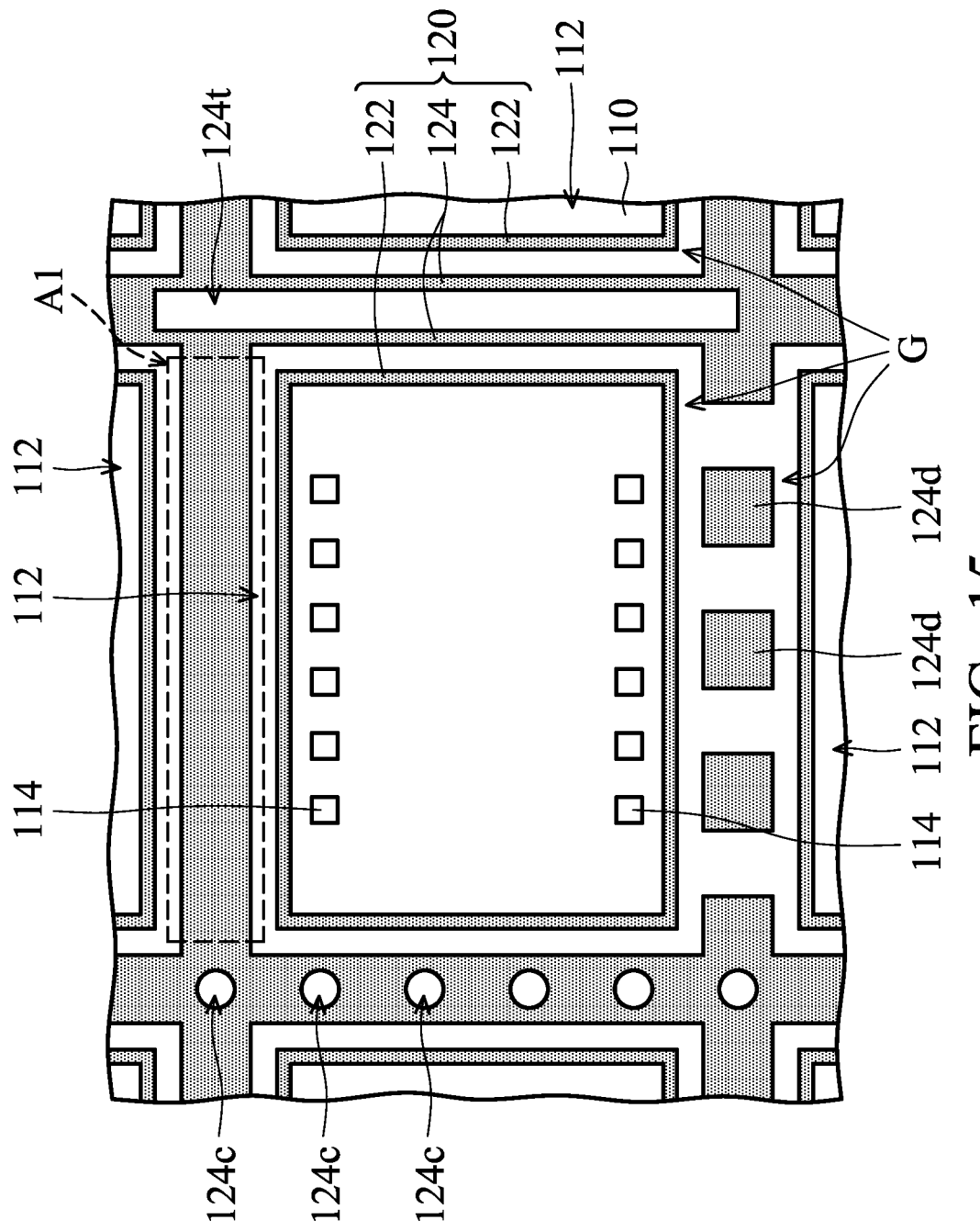
FIG. 15 is a top view of the substrate (lower substrate of a chip package structure) and the spacing layer according to embodiments of the present invention.

FIG. 15 is a top view of the substrate (lower substrate of a chip package structure) and the spacing layer according to embodiments of the present invention. Referring to FIG. 15, in one embodiment, the cutting support structure 124 may have an opening pattern passing therethrough. The opening pattern may include a plurality of holes 124c or a trench 124t. The cutting support structure 124 may be a continuous structure, as shown in the region A1 of FIG. 15. Alternatively, the cutting support structure 124 may be a discontinuous structure formed of a plurality of discontinuous portions 124d. Those skilled in the art will readily appreciate that the cutting support structure 124 shown in FIG. 15 can be applied to embodiments of FIGS. 1-14 selectively.

Figure 16:
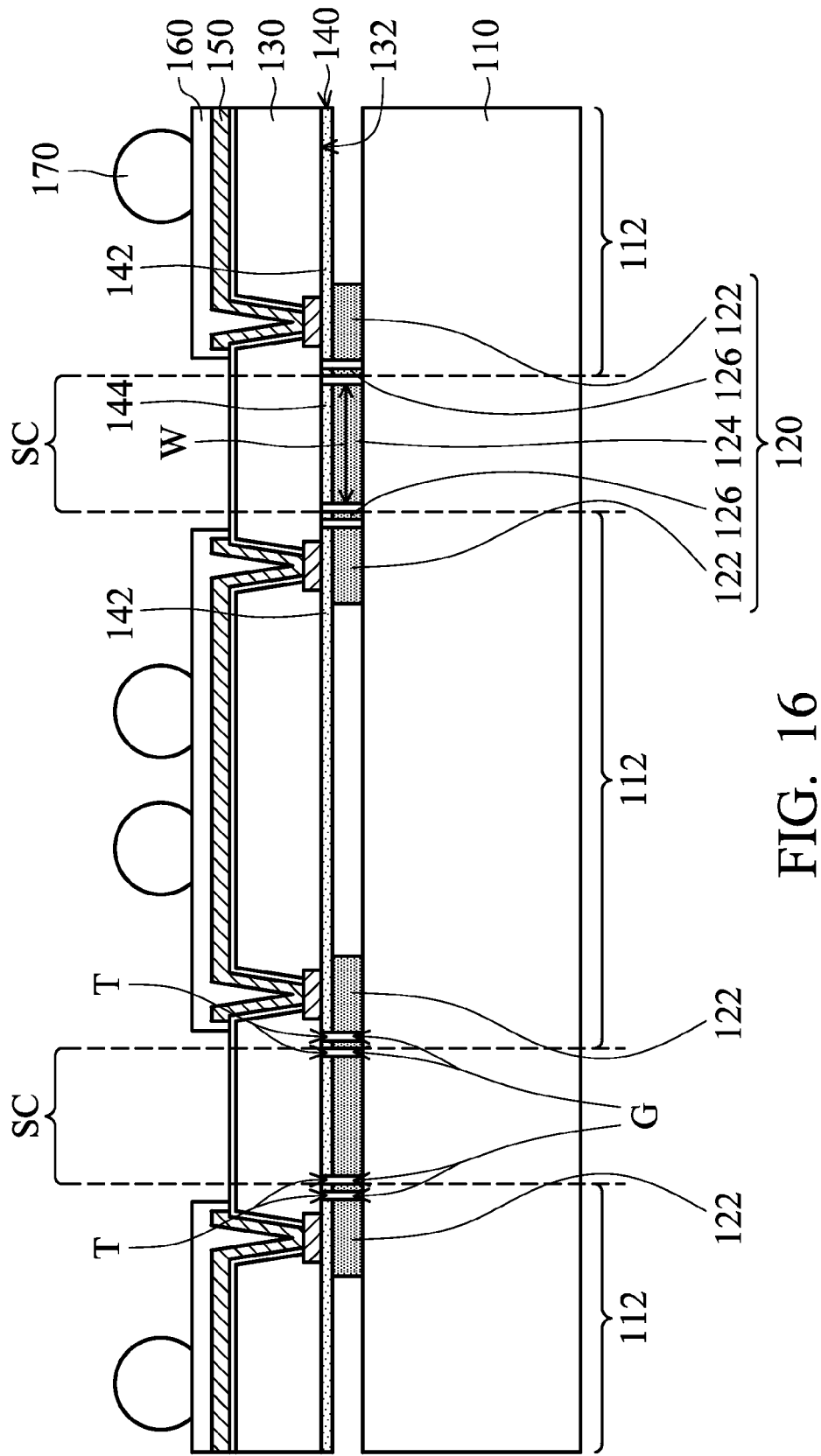
FIGS. 16 and 17 are cross-sectional views illustrating a manufacturing process of a chip package structure according to an embodiment of the present invention.
Figure 17:
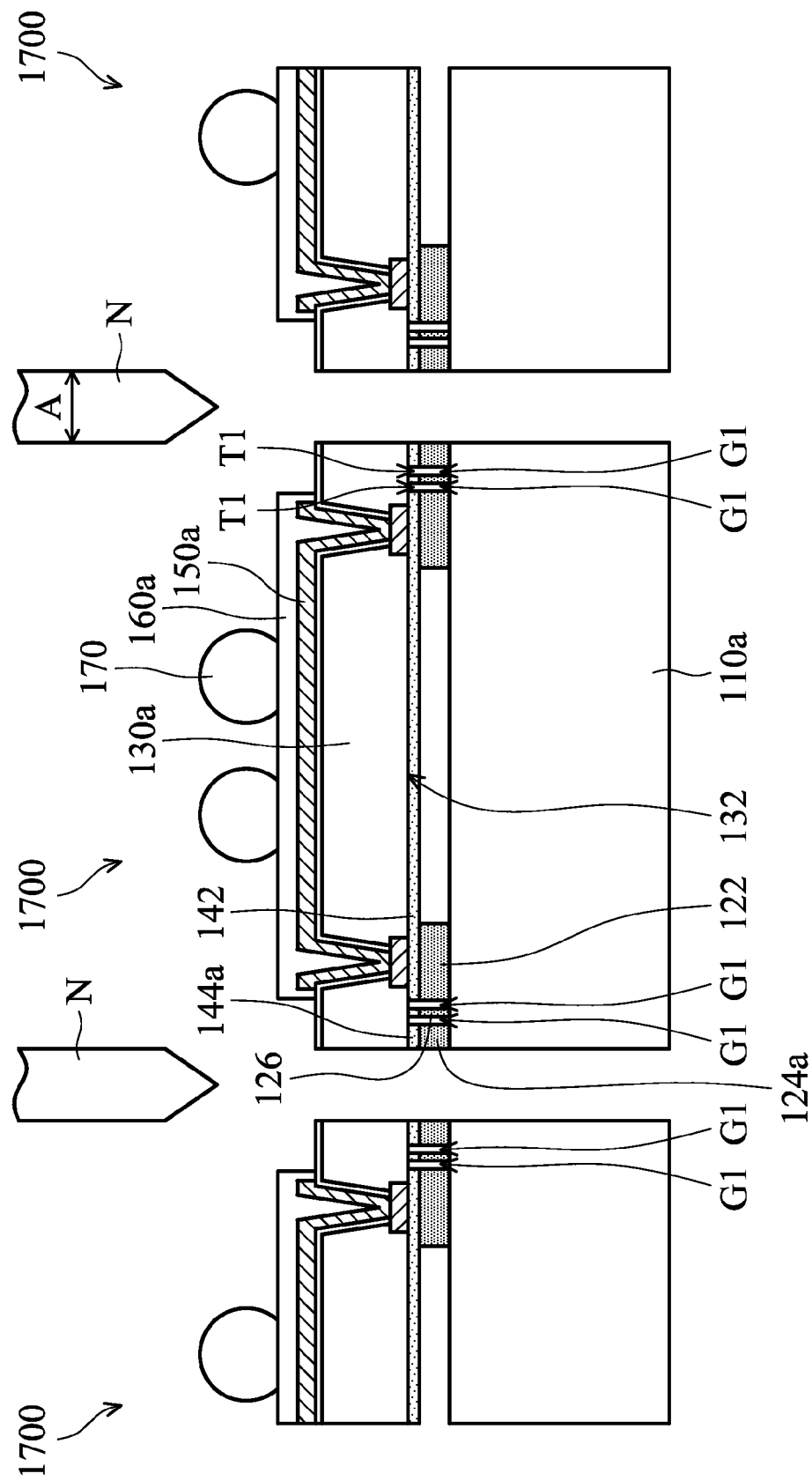
Figure 18:
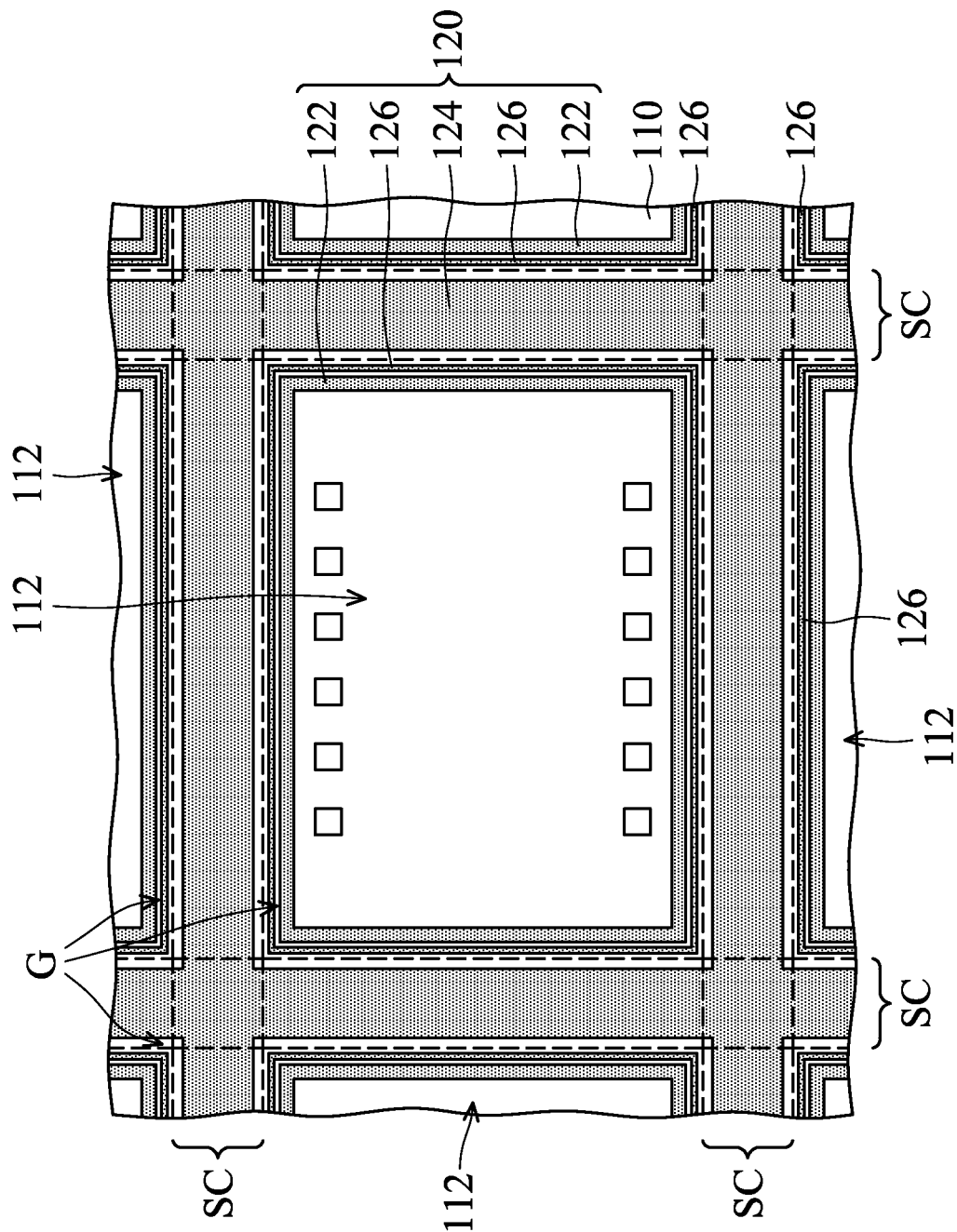
FIG. 18 is a top view of the substrate (lower substrate) and the spacing layer of FIG. 16.

FIGS. 16 and 17 are cross-sectional views illustrating a manufacturing process of a chip package structure according to an embodiment of the present invention. FIG. 18 is a top view of the substrate (lower substrate) and the spacing layer of FIG. 16. Referring to FIGS. 16 and 18, a substrate 110 is provided, and a spacing layer 120 is formed thereon, wherein the substrate 110 is structurally similar to the substrate 110 of FIG. 1, and thus description thereof is not repeated hereafter. The spacing layer 120 has a plurality of chip support rings 122, a cutting support structure 124, and a plurality of stop rings 126, wherein the cutting support structure 124 is located on peripheries of the chip support rings 122, and the stop ring 126 surrounds the chip support ring 122 and is located between the chip support ring 122 and the cutting support structure 124. The chip support rings 122, the cutting support structure 124, and the stop rings 126 are separated from each other by a gap pattern G. The chip support rings 122 are structurally similar to the chip support rings 122 of FIG. 1, and thus description thereof is not repeated hereafter.

Also, a substrate 130 is provided, wherein the substrate 130 is structurally similar to the substrate 130 of FIG. 1, and thus description thereof is not repeated hereafter. Then, a protective layer 140 is formed on a surface 132 of the substrate 130. Then, the substrate 130 is bonded to the substrate 110, with the spacing layer 120 sandwiched between the substrates 110 and 130.

Then, referring to FIGS. 16 and 17, the substrates 110 and 130 are cut along the predetermined scribe lines SC by using a cutting knife N to form a plurality of chip package structures 1700. In the present embodiment, a thickness A of the cutting knife N is less than a width W of the cutting support structure 124 on one of the predetermined scribe lines SC.

It should be noted that, the chip package structure 1700 of FIG. 17 is structurally similar to the chip package structure 700 of FIG. 7, except that the chip package structure 1700 further includes a stop ring 126 located between the outer wall structure 124a and the chip support ring 122. The stop ring 126, the outer wall structure 124a and the chip support ring 122 are separated from each other by gaps G1 therebetween.

Figure 19:
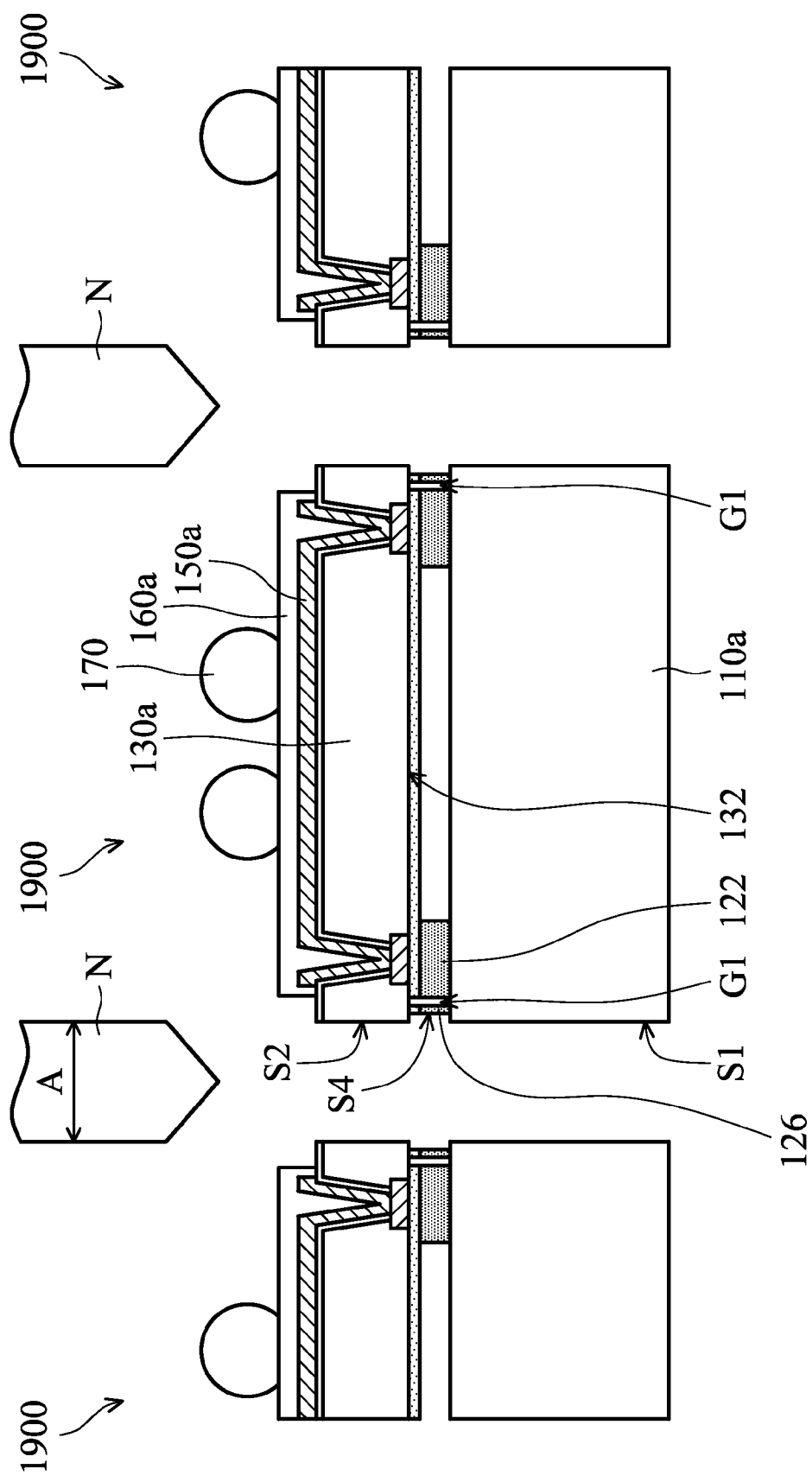
FIG. 19 is a cross-sectional view illustrating a manufacturing process of a chip package structure according to another embodiment of the present invention.

FIG. 19 is a cross-sectional view illustrating a manufacturing process of a chip package structure according to another embodiment of the present invention. In another embodiment, after the process step of FIG. 16, the process of FIG. 19 is performed. That is to say, as shown in FIGS. 16 and 19, the substrates 110 and 130 are cut along the predetermined scribe lines SC by using a cutting knife N to form a plurality of chip package structures 1900. A thickness A of the cutting knife N is larger than or equal to a width W of the cutting support structure 124 on one of the predetermined scribe lines SC. In this case, the cutting support structure 124 may be removed completely by using the cutting knife N. In one embodiment, as shown in FIG. 19, a sidewall S4 of the stop ring 126 is recessed from sidewalls S1 and S2 of the substrates 110a and 130a. In another embodiment, the sidewall (not shown) of the stop ring 126 is aligned to the sidewalls S1 and S2 of the substrates 110a and 130a.

It should be noted that, in the present embodiment, the stop ring 126 surrounding the chip support ring 122 located in the device region 112 (as shown in FIGS. 16 and 18) may prevent gases or fluids used in the manufacturing process or environmental moisture from diffusing or permeating into the device region 112.

As described above, in the present invention, because the cutting support structure is formed between two stacking substrates and on (or adjacent to) the predetermined scribe lines, the cutting support structure and the chip support rings adjacent thereto may jointly support the substrate during the cutting process. Thus, a cutting edge of the substrate has sufficient mechanical integrity to retain its shape and prevent fracture during the cutting operation, so as to improve the reliability of resulting chip package structures.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A manufacturing method of a chip package structure, comprising:
providing a first substrate having a plurality of predetermined scribe lines for defining a plurality of device regions;
bonding a second substrate to the first substrate with a spacing layer disposed therebetween, wherein the spacing layer has a plurality of chip support rings located in the device regions, a cutting support structure located on peripheries of the chip support rings, a plurality of stop rings surrounding the chip support rings respectively, wherein each of the stop rings is located between the corresponding chip support ring and the cutting support structure, and a gap pattern separating the stop rings from the cutting support structure and the chip support rings; and
cutting the first substrate and the second substrate along the predetermined scribe lines to form a plurality of chip package structures.

2. The manufacturing method of the chip package structure as claimed in claim 1, wherein the cutting support structure is located on the predetermined scribe lines.

3. The manufacturing method of the chip package structure as claimed in claim 2, wherein the step of cutting the first substrate and the second substrate comprises:
cutting the first substrate and the second substrate along the predetermined scribe lines by using a cutting knife, wherein a thickness of the cutting knife is less than a width of a portion of the cutting support structure on one of the predetermined scribe lines.

4. The manufacturing method of the chip package structure as claimed in claim 3, wherein at least one of the chip package structures includes an outer wall structure formed from the cutting support structure.

5. The manufacturing method of the chip package structure as claimed in claim 2, wherein the step of cutting the first substrate and the second substrate comprises:
cutting the first substrate and the second substrate along the predetermined scribe lines by using a cutting knife, wherein a thickness of the cutting knife is larger than or equal to a width of a portion of the cutting support structure on one of the predetermined scribe lines.

6. The manufacturing method of the chip package structure as claimed in claim 5, wherein the step of cutting the first substrate and the second substrate further comprises:
removing a portion of the cutting support structure on at least one of the predetermined scribe lines completely by using the cutting knife.

7. The manufacturing method of the chip package structure as claimed in claim 1, further comprising:
forming a protective layer on the second substrate, wherein the protective layer covers a surface of the second substrate facing the first substrate and is located between the second substrate and the spacing layer.

8. The manufacturing method of the chip package structure as claimed in claim 7, further comprising:
before bonding the first substrate to the second substrate, forming a notch pattern passing through the protective layer, and after bonding the first substrate to the second substrate, the notch pattern is aligned to the gap pattern.

9. The manufacturing method of the chip package structure as claimed in claim 1, wherein the cutting support structure is located adjacent to the predetermined scribe lines.

10. The manufacturing method of the chip package structure as claimed in claim 9, wherein the cutting support structure has a trench passing therethrough and on the predetermined scribe lines, and the step of cutting the first substrate and the second substrate comprises:
cutting the first substrate and the second substrate along the predetermined scribe lines by using a cutting knife, wherein a thickness of the cutting knife is less than or equal to a width of the trench.

11. The manufacturing method of the chip package structure as claimed in claim 1, wherein the cutting support structure has an opening pattern passing therethrough.

12. The manufacturing method of the chip package structure as claimed in claim 1, wherein at least one of the first substrate and the second substrate has a through substrate via (TSV).

13. The manufacturing method of the chip package structure as claimed in claim 12, wherein the step of cutting the first substrate and the second substrate comprises:
first cutting one of the first substrate and the second substrate having the through substrate via.

14. The manufacturing method of the chip package structure as claimed in claim 1, wherein the cutting support structure has a non-bonding surface facing the first substrate or the second substrate.

\* \* \* \* \*